United States Patent
Kamatani

(10) Patent No.: US 7,856,039 B2
(45) Date of Patent: Dec. 21, 2010

(54) SEMICONDUCTOR DEVICE AND SEMICONDUCTOR LASER DRIVING DEVICE

(75) Inventor: Tomohiko Kamatani, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 182 days.

(21) Appl. No.: 12/325,873

(22) Filed: Dec. 1, 2008

(65) Prior Publication Data

US 2009/0141762 A1  Jun. 4, 2009

(30) Foreign Application Priority Data

Nov. 30, 2007  (JP) ............................. 2007-310418

(51) Int. Cl.
*H01S 3/00* (2006.01)
(52) U.S. Cl. ................ 372/38.02; 372/38.1; 372/38.03; 372/38.07
(58) Field of Classification Search .... 372/38.01–38.09
See application file for complete search history.

(56) References Cited

U.S. PATENT DOCUMENTS 5,163,063 A * 11/1992 Yoshikawa et al. ....... 372/38.02
6,795,656 B1 * 9/2004 Ikeuchi et al. ............... 398/197
7,693,196 B2 * 4/2010 Kamatani et al. ........ 372/38.01
2006/0133435 A1 * 6/2006 Ikeda ...................... 372/38.02

FOREIGN PATENT DOCUMENTS

| JP | 5-30314 | 2/1993 |
| JP | 8-83950 | 3/1996 |
| JP | 2644722 | 5/1997 |
| JP | 2007-73543 | 3/2007 |
| JP | 2007-210238 | 8/2007 |

* cited by examiner

*Primary Examiner*—Minsun Harvey
*Assistant Examiner*—Delma R Forde
(74) *Attorney, Agent, or Firm*—Dickstein Shapiro LLP

(57) ABSTRACT

In a semiconductor device, a switching current generator circuit generates and outputs a switching current such that a voltage input to a switching current setting terminal is equal to a voltage input to a switching current control terminal, and a bias current generator circuit generates and outputs a bias current such that a voltage input to a bias current setting terminal equals a voltage input to a bias current control terminal. A memory circuit inputs a voltage according to an amount of light emitted by a semiconductor laser, and generates a voltage to make the input voltage equal to a predetermined first reference voltage corresponding to a predetermined amount of light. An APC output terminal outputs the voltage output by the memory circuit to an external device. A current adding circuit combines the switching current and the bias current to generate a drive current to drive the semiconductor device.

8 Claims, 9 Drawing Sheets

SEMICONDUCTOR DEVICE AND SEMICONDUCTOR LASER DRIVING DEVICE

CROSS-REFERENCE TO RELATED APPLICATIONS

The present application is based on and claims priority from Japanese Patent Application No. 2007-310418, filed on Nov. 30, 2007 in the Japan Patent Office, the entire contents of which are hereby incorporated herein by reference.

BACKGROUND OF THE INVENTION

1. Field of the Invention

Exemplary aspects of the present invention relate to a semiconductor device and a semiconductor laser driving device, and more particularly, to a semiconductor device and a semiconductor laser driving device for driving a semiconductor laser used for an optical writing unit of a laser printer, optical data communication, an optical disk, and the like.

2. Description of the Related Art

A conventional method of controlling an amount of light emitted by a semiconductor laser used for image writing using an image forming apparatus is the so-called APC (automatic power control) method. In the APC method, a photosensor is provided near a semiconductor laser to periodically detect a laser beam emitted by the semiconductor laser, and a signal detected by the photosensor is fed back to a semiconductor laser driving circuit as a feedback signal to maintain an amount of light emitted by the semiconductor laser at a predetermined level.

FIGS. 1 and 2 are graphs illustrating a relation between a drive current and an amount of light emitted by a semiconductor laser. Generally, a drive current of the semiconductor laser is obtained by combining a bias current Ibi and a switching current Isw, because the relation between the amount of light and the drive current of the semiconductor laser is non-linear, as illustrated in FIGS. 1 and 2.

That is, the semiconductor laser emits only a small amount of light when the drive current does not satisfy a threshold level current Ith, but after exceeding the threshold current Ith, the amount of light emitted by the semiconductor laser increases as the more the drive current exceeds the threshold current Ith (light-emitting current Iη).

When the drive current of the semiconductor laser increases from zero to a level required to emit a predetermined amount of light, it takes a long time for the semiconductor laser to start to emit light. Alternatively, the semiconductor laser may be continuously supplied with a bias current Ibi close to the threshold current Ith, and an amount of a switching current Isw that corresponds to a difference between the drive current and the bias current Ibi is switched on and off to provide high-speed, precision control of laser light emission.

More specifically, FIG. 1 illustrates the relation between a drive current and an amount of light emitted by a semiconductor laser greatly fluctuating in a threshold current Ith. For example, as the semiconductor laser heats up the threshold current Ith changes and increases to a threshold current IthH, as indicated by line B. Therefore, in order to emit the same amount of light, the semiconductor laser needs a larger threshold current IbiH.

FIG. 2 illustrates the relation between a drive current and an amount of light emitted by a semiconductor laser greatly fluctuating in light emitting efficiency. Note that the light emitting efficiency Is a relation between a light-emitting current In and an amount of light. In this example, the light-emitting efficiency decreases as the semiconductor laser heats up, as indicated by line C. Therefore, the semiconductor laser needs a larger switching current IswH in order to emit the same amount of light.

Therefore, some related-art semiconductor laser driving devices using the APC method control the bias current Ibi based on a signal detected by a photosensor. However, such semiconductor laser driving devices are not appropriate for a semiconductor laser with large fluctuations in light emitting efficiency like those illustrated in FIG. 2.

Other related-art semiconductor laser driving devices control both the bias current Ibi and the switching current Isw based on a signal detected by a photosensor. However, such semiconductor laser driving devices have a complicated circuit configuration and thus are expensive.

It is also to be noted that, when conventional light amount control circuits are integrated into a single IC (integrated circuit) chip, it is difficult to easily change circuit configuration according to variations in size, temperature characteristic, or the like of each semiconductor laser.

Accordingly, there is a need for a technology to provide a semiconductor device and a semiconductor laser driving device capable of flexibly accommodating different circuit configurations depending on specific characteristics of each semiconductor laser.

BRIEF SUMMARY OF THE INVENTION

This specification describes a semiconductor device according to illustrative embodiments of the present invention.

In one illustrative embodiment of the present invention, the semiconductor device includes a switching current control terminal, a switching current setting terminal, a switching current generator circuit, a bias current control terminal, a bias current setting terminal, a bias current generator circuit, a memory circuit, an APC output terminal, and a current adding circuit. The switching current generator circuit is configured to generate and output the switching current such that a voltage input to the switching current setting terminal is equal to a voltage input to the switching current control terminal. The bias current generator circuit is configured to generate and output the bias current so that a voltage input to the bias current setting terminal is equal to a voltage input to the bias current control terminal. The memory circuit is configured to receive a voltage according to an amount of light emitted by the semiconductor laser and generate a voltage to make the received voltage equal to a predetermined first reference voltage that corresponds to a predetermined amount of light, store the generated voltage, and output the stored voltage. The APC output terminal is configured to output the voltage output by the memory circuit to an external device. The current adding circuit is configured to combine the switching current and the bias current to generate the drive current to drive the semiconductor device.

This specification further describes a semiconductor laser driving device according to illustrative embodiments of the present invention.

In one illustrative embodiment of the present invention, the semiconductor laser driving device includes a light amount detector circuit and a semiconductor device. The light amount detector circuit is configured to detect an amount of light emitted by a semiconductor laser, generate a voltage according to the amount of light, and output the generated voltage. The semiconductor device is configured to drive the semiconductor laser with a drive current combining a bias current and a switching current. The semiconductor device includes a switching current control terminal, a switching current setting terminal, a switching current generator circuit, a bias current control terminal, a bias current setting terminal, a bias current generator circuit, a memory circuit, an APC output terminal, and a current adding circuit as described above.

BRIEF DESCRIPTION OF THE DRAWINGS

A more complete appreciation of the invention and the many attendant advantages thereof will be more readily obtained as the same becomes better understood by reference to the following detailed description when considered in connection with the accompanying drawings, wherein.

DETAILED DESCRIPTION OF EMBODIMENTS OF THE INVENTION

Figure 1:
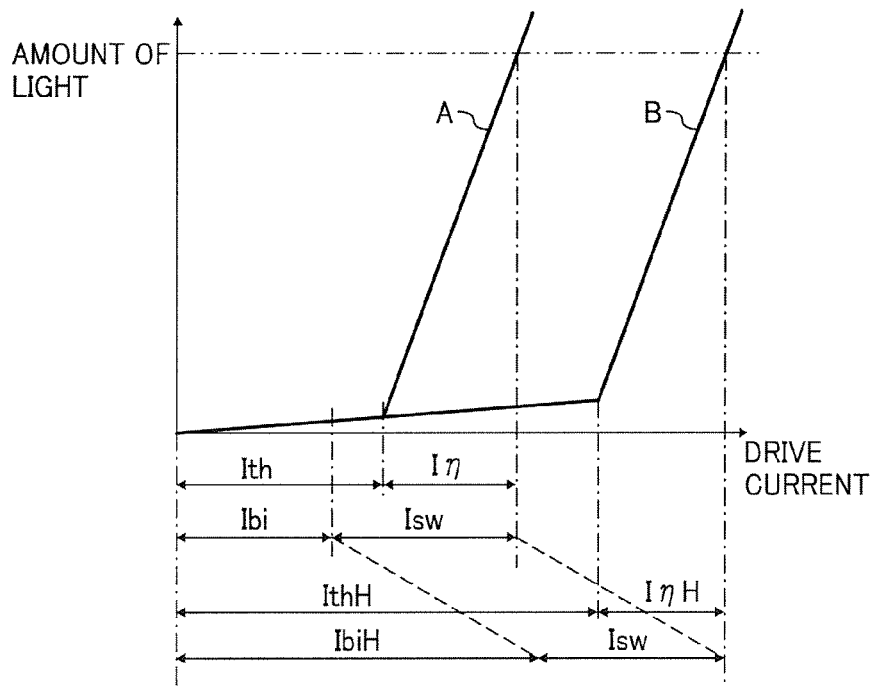
FIG. 1 is a graph illustrating a relation between a drive current and an amount of light emitted by one type of semiconductor laser.
Figure 2:
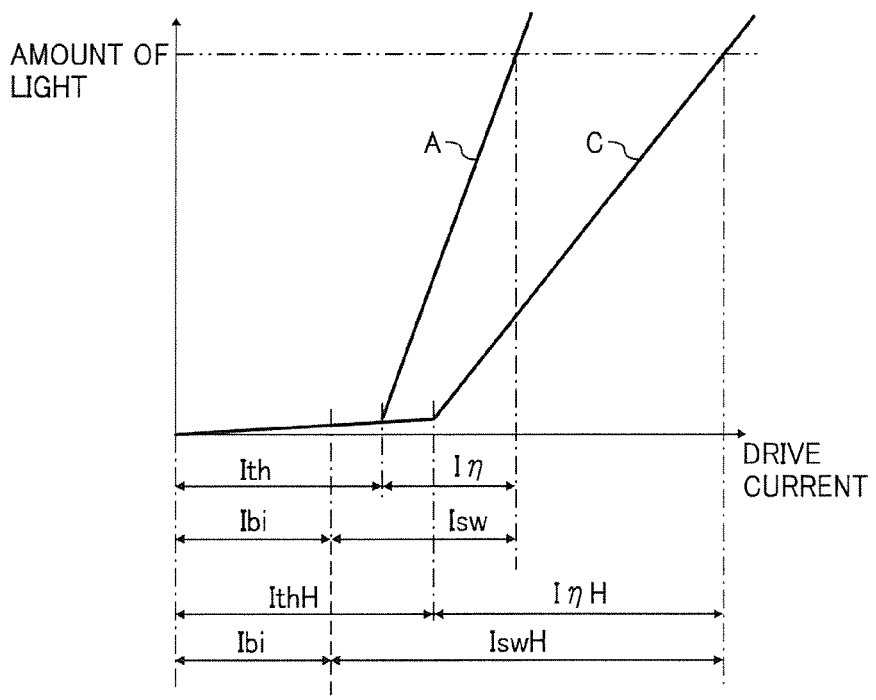
FIG. 2 is a graph illustrating a relation between a drive current and an amount of light emitted by another type of semiconductor laser.

In describing illustrative embodiments illustrated in the drawings, specific terminology is employed for the sake of clarity. However, the disclosure of this specification is not intended to be limited to the specific terminology so selected, and it is to be understood that each specific element includes all technical equivalents that operate in a similar manner and achieve a similar result.

Figure 3:
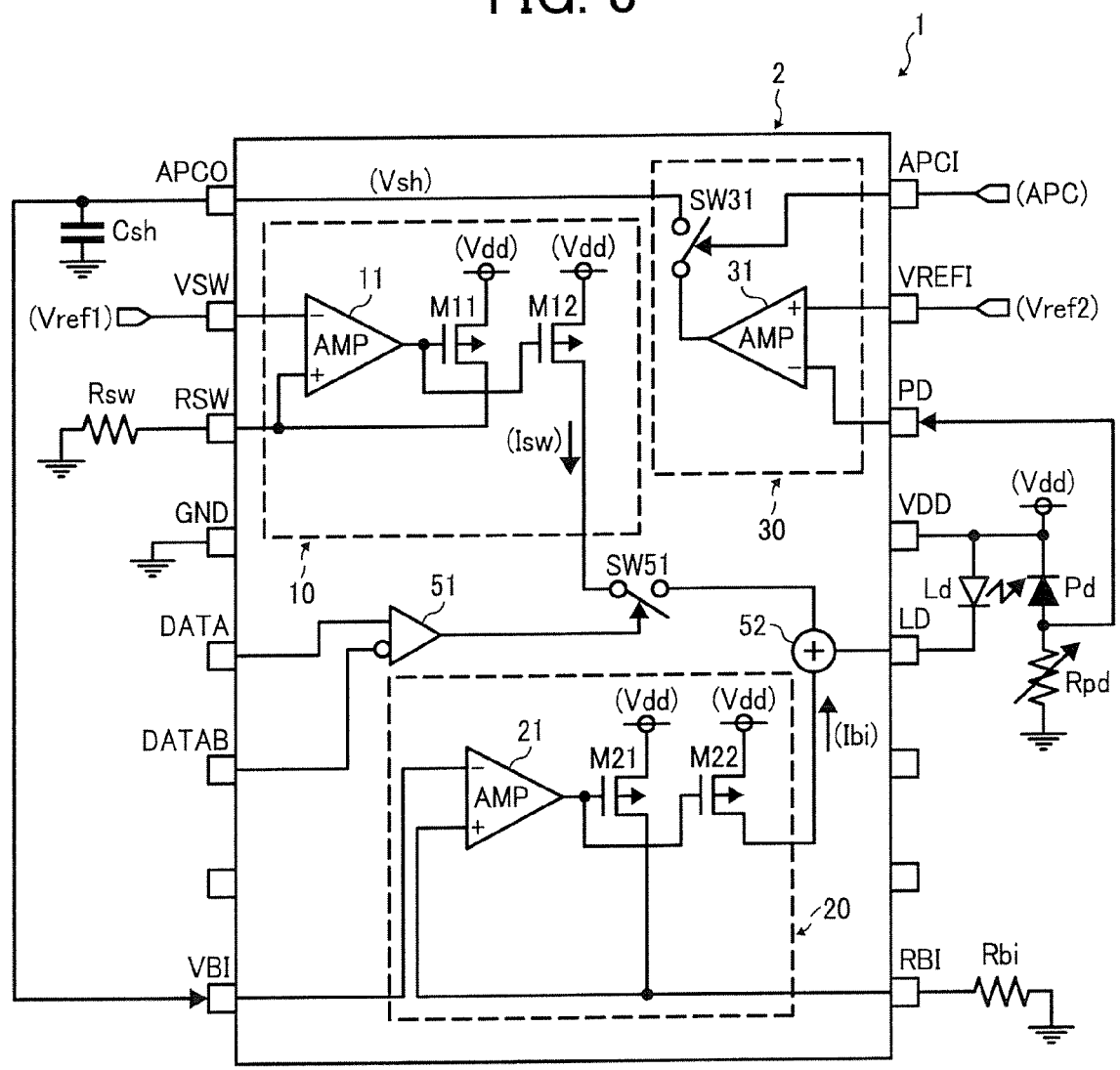
FIG. 3 is a circuit diagram of a semiconductor laser driving device according to an illustrative embodiment of the present invention.

Referring now to the drawings, wherein like reference numerals designate identical or corresponding parts throughout the several views, in particular to FIG. 3, a semiconductor laser driving device 1 according to an illustrative embodiment of the present invention is described.

FIG. 3 is a circuit diagram of the semiconductor laser driving device 1. The semiconductor laser driving device 1 includes a semiconductor 2, a photodiode Pd, a variable resistor Rpd, a switching current setting resistor Rsw, a bias current setting resistor Rbi, and a sample-hold capacitor Csh. The semiconductor 2 includes a switching current generator circuit 10, a bias current generator circuit 20, a memory circuit 30, a data signal driver circuit 51, a current adding circuit 52, a switching current control switch SW51, an APC output terminal APCO, a switching current control terminal VSW, a switching current setting terminal RSW, write data terminals DATA and DATAB, a bias current control terminal VBI, a bias current setting terminal RBI, a laser diode connection terminal LD, a photodiode connection terminal PD, a reference voltage input terminal VREFI, an APC signal input terminal APCI, a power supply terminal VDD, and a ground terminal GND.

The switching current generator circuit 10 includes an operational amplifier 11 and PMOS transistors M11 and M12. The bias current generator circuit 20 includes an operational amplifier 21 and PMOS transistors M21 and M22. The memory circuit 30 includes an operational amplifier 31 and a switch SW31. It is to be noted that the photodiode Pd and the variable resistor Rpd serve as a light amount detection circuit.

The semiconductor laser driving device 1 performs APC (automatic power control) for maintaining an amount of light emitted by a semiconductor laser such as a laser diode (Ld) at a constant level, since forward current and light output characteristic (i-L characteristic) of the Ld fluctuates with temperature change and aging deterioration. More specifically, when the light of the laser diode Ld strikes the photodiode Pds, the semiconductor laser driving device 1 performs APC and adjusts the light output level according to the amount of light received by the photodiode Pd. It is to be noted that the semiconductor laser driving device 1 is used for an image forming apparatus, For example, a laser printer, a digital copier, and the like.

As illustrated in FIG. 3, the APC output terminal APCO is connected to the bias current control terminal VBI, and the sample-hold capacitor Csh is connected between the APC output terminal APCO and a ground potential (ground). A predetermined reference voltage Vref1, serving as a second reference voltage, is input to the switching current control terminal VSW, the switching current setting resistor Rsw is connected between the switching current setting terminal RSW and a ground potential, and the bias current setting resistor Rbi is connected between the bias current setting terminal RBI and a ground potential. The switching current setting resistor Rsw and the bias current setting resistor Rbi may be incorporated into the semiconductor 2 when resistances thereof need not be varied.

An anode of the laser diode Ld is connected to the power supply terminal VDD, and a cathode of the laser diode LD is connected to the laser diode connection terminal LD, respectively. A cathode of the photodiode Pd is connected to the power supply terminal VDD, and an anode of the photodiode Pd is connected to the photodiode connection terminal PD, respectively. A power supply voltage Vdd is input to the power supply terminal VDD, and the variable resistor Rpd, which is capable of adjusting resistance, is connected between the photodiode connection terminal PD and a ground potential. A predetermined reference voltage Vref2, serving as a first reference voltage, is input to the reference voltage input terminal VREFI, and an APC signal is input to the APC signal input terminal APCI, respectively. The ground terminal GND is connected to a ground potential.

A configuration of the switching current generator circuit 10 is described below.

An inverting input terminal of the operational amplifier 11 is connected to the switching current control terminal VSW, a non-inverting input terminal of the operational amplifier 11 is connected to the switching current setting terminal RSW, and an output terminal of the operational amplifier 11 is connected to each gate of the PMOS transistors M11 and M12. A source of the PMOS transistor M11 is connected to a power supply voltage Vdd, and a drain of the PMOS transistor M11 is connected to the switching current setting terminal RSW. A source of the PMOS transistor M12 is connected to a power supply voltage Vdd, and a drain the PMOS transistor M12 is connected to one end of the switching current control switch SW51. The PMOS transistor M11 outputs a drain current proportional to a drain current of the PMOS transistor M12, and the drain current of the PMOS transistor M12 is output as a switching current Isw.

As illustrated in FIG. 3, the bias current generator circuit 20 has a circuit configuration similar to that of the switching current generator circuit 10. An inverting input terminal of the operational amplifier 21 is connected to the bias current control terminal VBI, a non-inverting input terminal of the operational amplifier 21 is connected to the bias current setting terminal RBI, and an output terminal of the operational amplifier 21 is connected to each gate of the PMOS transistors M21 and M22. A source of the PMOS transistor M21 is connected to a power supply voltage Vdd, and a drain of the PMOS transistor M21 is connected to the bias current setting terminal RBI. A source of the PMOS transistor M22 is connected to a power supply voltage Vdd, and a drain of the PMOS transistor M22 is connected to one input terminal of the current adding circuit 52. The PMOS transistor M21 outputs a drain current proportional to a drain current of the PMOS transistor, and the drain current of the PMOS transistor M22 is output as a bias current Ibi.

A configuration of the memory circuit 30 is described below.

As illustrated in FIG. 3, an inverting input terminal of the operational amplifier 31 is connected to the photodiode connection terminal PD, a non-inverting input terminal of the operational amplifier 31 is connected to the reference voltage input terminal VREFI, and an output terminal of the operational amplifier 31 is connected to one end of the switch SW31, respectively. Another end of the switch SW31 is connected to the APC output terminal APCO, and a control electrode of the switch SW31 is connected to the APC signal input terminal APCI. When, for example, the APC signal is at a low level, the switch SW31 is turned on to be in a state of conduction (conductive state), and when the APC signal is high, the switch SW31 is turned off to be in a shutoff state.

One input terminal of the data signal driver circuit 51 is connected to the write data terminal DATA, another input terminal of the data signal driver circuit 51 is connected to the write data terminal DATAB, and an output terminal of the data signal driver circuit 51 is connected to a control electrode of the switching current control switch 51.

Another end of the switching current control switch SW51 is connected to another input terminal of the current adding circuit 52. When a predetermined write signal is input to the write data terminals DATA and DATAB, the switching current control switch SW51 is turned on to be in a conductive state and supplies the switching current Isw generated by the switching current generator circuit 10 to the current adding circuit 52.

The respective input terminals of the current adding circuit 52 are connected to an output terminal of the switching current generator circuit 10 and an output terminal of the bias current generator circuit 20, respectively, and an output terminal of the current adding circuit 52 is connected to the laser diode connection terminal LD. The current adding circuit 52 combines the switching current Isw and the bias current Ibi input to the respective input terminals thereof and outputs a sink current as a drive current of the laser diode Ld.

A description is now given of operation of the switching current generator circuit 10.

A drain current of the PMOS transistor M11 is supplied to the switching current setting resistor Rsw connected between the switching current setting terminal RSW and the ground potential. The operational amplifier 11 controls a gate voltage of the PMOS transistor Mil such that a voltage drop across the switching current setting resistor Rsw is equal to the reference voltage Vref1, thereby controlling the drain current of the PMOS transistor M11.

To be specific, a value of the drain current of the PMOS transistor M11 is obtained I=V/R, which in this case is obtained by a following formula (1):

$$Vref1/rsw \qquad (1)$$

where "rsw" represents the resistance of the switching current setting resistor Rsw.

Since the drain current of the PMOS transistor M12 is proportional to the drain current of the PMOS transistor M11, a value of the drain current of the PMOS transistor M12 is set by the reference voltage Vref1 and the switching current setting resistor Rsw. Therefore, since the switching current Isw output from the drain of the PMOS transistor M12 is set by the reference voltage Vref1 and the switching current setting resistor Rsw, the switching current Isw maintains a constant current amount. As described above, the switching current Isw is input to the current adding circuit 52 through the switching current control switch SW51, and combined with the bias current Ibi by the current adding circuit 52 to be output as the drive current of the laser diode Ld connected to the laser diode connection terminal LD.

A description is now given of the bias current generator circuit 20.

A drain current of the PMOS transistor M21 is supplied to the bias current setting resistor Rbi connected between the bias current setting terminal RBI and the ground potential. The operational amplifier 21 controls a gate voltage of the PMOS transistor M21 such that a voltage drop across the bias current setting resistor Rbi is equal to an output voltage Vsh of the memory circuit 30, thereby controlling the drain current of the PMOS transistor M21.

To be specific, a value of the drain current of the PMOS transistor M21 is obtained by a following formula (2):

$$Vsh/rbi \qquad (2)$$

where "rbi" represents the resistance of the bias current setting resistor Rbi.

As in the switching current generator circuit 10, since the drain current of the PMOS transistor M22 is proportional to the drain current of the PMOS transistor M21, a value of the drain current of the PMOS transistor M22 is set by the output voltage Vsh of the memory circuit 30 and the bias current setting resistor Rbi. Note that the drain current of the PMOS transistor M22 becomes the bias current Ibi. Since the output voltage Vsh of the memory circuit 30 fluctuates according to variations in size, temperature change, or the like of the laser diode Ld, the bias current Ibi also fluctuates according to the fluctuation of the output voltage Vsh of the memory circuit 30. The bias current Ibi is input to the current adding circuit 52, and combined with the switching current Isw to be output as the drive current of the laser diode Ld connected to the laser diode connection terminal LD.

A description is now given of operation of the memory circuit 30.

Before image writing, when the APC signal input to the APC signal input terminal APCI is at a low level, the switch 31 is turned on to create a conductive state. When a write data signal is input to the write data terminals DATA and DATAB, the switching current control switch SW51 is turned on to create a conductive state. Therefore, the laser diode Ld is supplied with the drive current combining the switching current Isw and the bias current Ibi, thereby emitting light. When the laser diode Ld emits light, the photodiode Pd provided in the vicinity of the laser diode Ld detects an amount of light emitted by the laser diode Ld.

When a photoelectric current proportional to the amount of light emitted by the laser diode Ld flows through the photodiode Pd, the variable resistor Rpd converts the photoelectric current into a voltage. The converted voltage is input to the inverting input terminal of the operational amplifier 31 through the photodiode connection terminal PD. The reference voltage Vref2 is input externally to the non-inverting input terminal of the operational amplifier 31. The operational amplifier 31 controls the bias current Ibi such that a voltage drop across the variable resistor Rpd is equal to the reference voltage Vref2, thereby obtaining a predetermined amount of light emitted by the laser diode Ld. When this occurs, the sample-hold capacitor Csh is charged with the output voltage Vsh of the operational amplifier 31. It is to be noted that the reference voltage Vref1 may be equal to the reference voltage Vref2.

Immediately before image writing, when the APC signal is high, the switch SW31 is turned off to create a shutdown state. Therefore, the sample-hold capacitor Csh stores the output voltage Vsh of the operational amplifier 31 immediately before image writing.

During image writing, since the APC signal is kept high, the value of the bias current Ibi remains unchanged. The switching current control switch SWS1 repeats turning on and off to cause the laser diode Ld to emit a laser beam and stop a laser beam emission, thereby forming a desired image according to the write data signals input from the outside of the semiconductor device 2.

As described above, the APC output terminal APCO is connected to the bias current control terminal VBI. Alternatively, however, the APC output terminal APCO may be connected to the switching current control terminal VSW, and the reference voltage Vref1 may be input to the bias current control terminal VBI. Therefore, the bias current Ibi is kept constant, while the current value of the switching current Isw varies according to the output voltage Vsh of the memory circuit 30. Thus, the semiconductor laser driving device 1 is a circuit configuration more suitable for controlling a laser diode Ld that has a large fluctuation in a light-emitting efficiency than a laser diode that has a large fluctuation in a threshold current Ith.

According to the illustrative embodiment, by controlling the bias current Ibi by APC, the semiconductor laser driving device 1 is more suitable for controlling the laser diode Ld that has a large fluctuation in a threshold current Ith than a laser diode that has a large fluctuation in a light-emitting efficiency. In addition, merely by changing a connection to which the APC output terminal APCO is connected, the semiconductor laser driving device 1 also has a circuit for controlling the switching current Isw by APC. Therefore, the semiconductor laser driving device 1 is appropriate for both a laser diode Ld that has a large fluctuation in the threshold current Ith and a laser diode Ld that has a large fluctuation in light-emitting efficiency.

Figure 4:
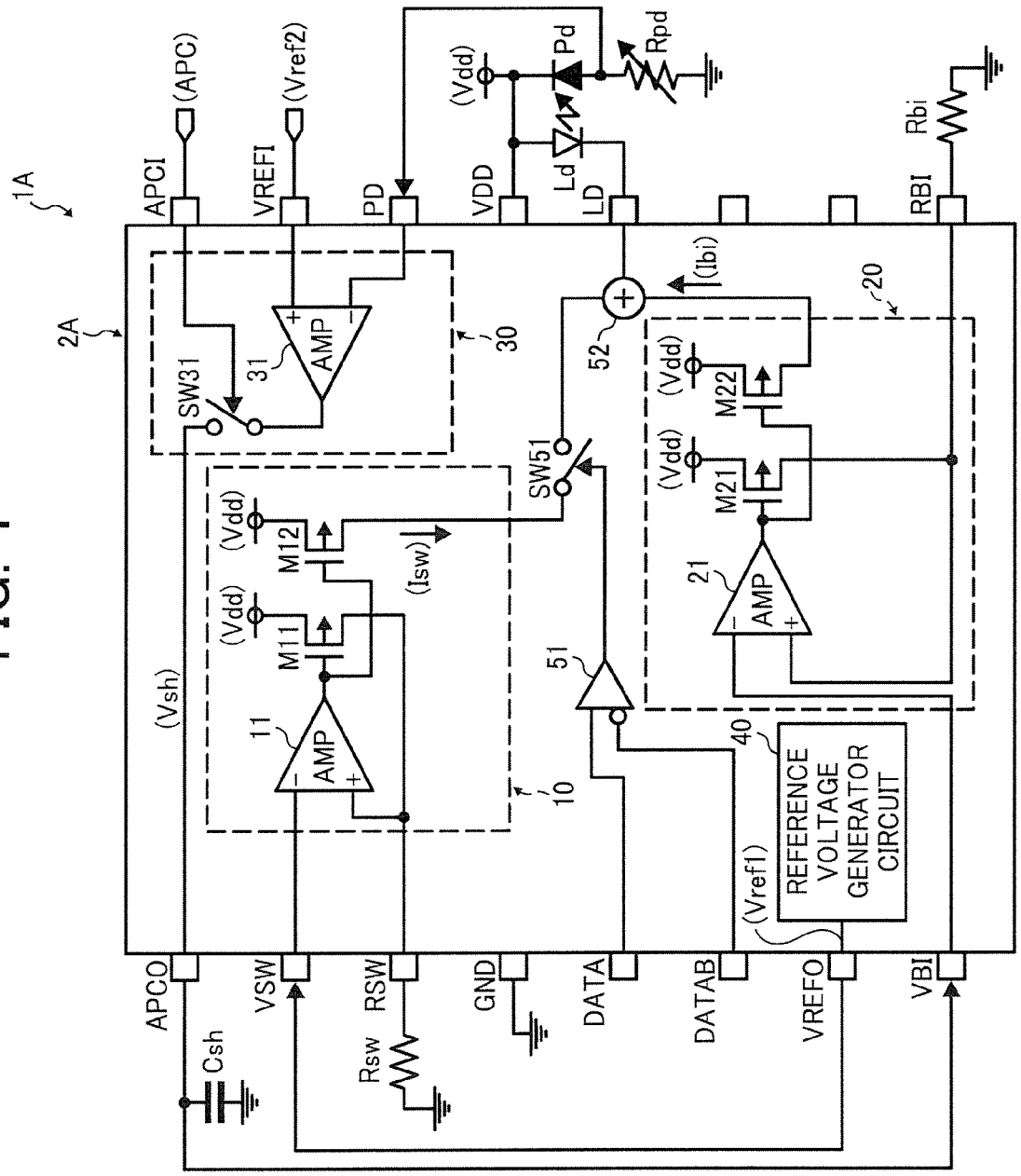
FIG. 4 is a circuit diagram of a semiconductor laser driving device according to another illustrative embodiment of the present invention 2.
Figure 5:
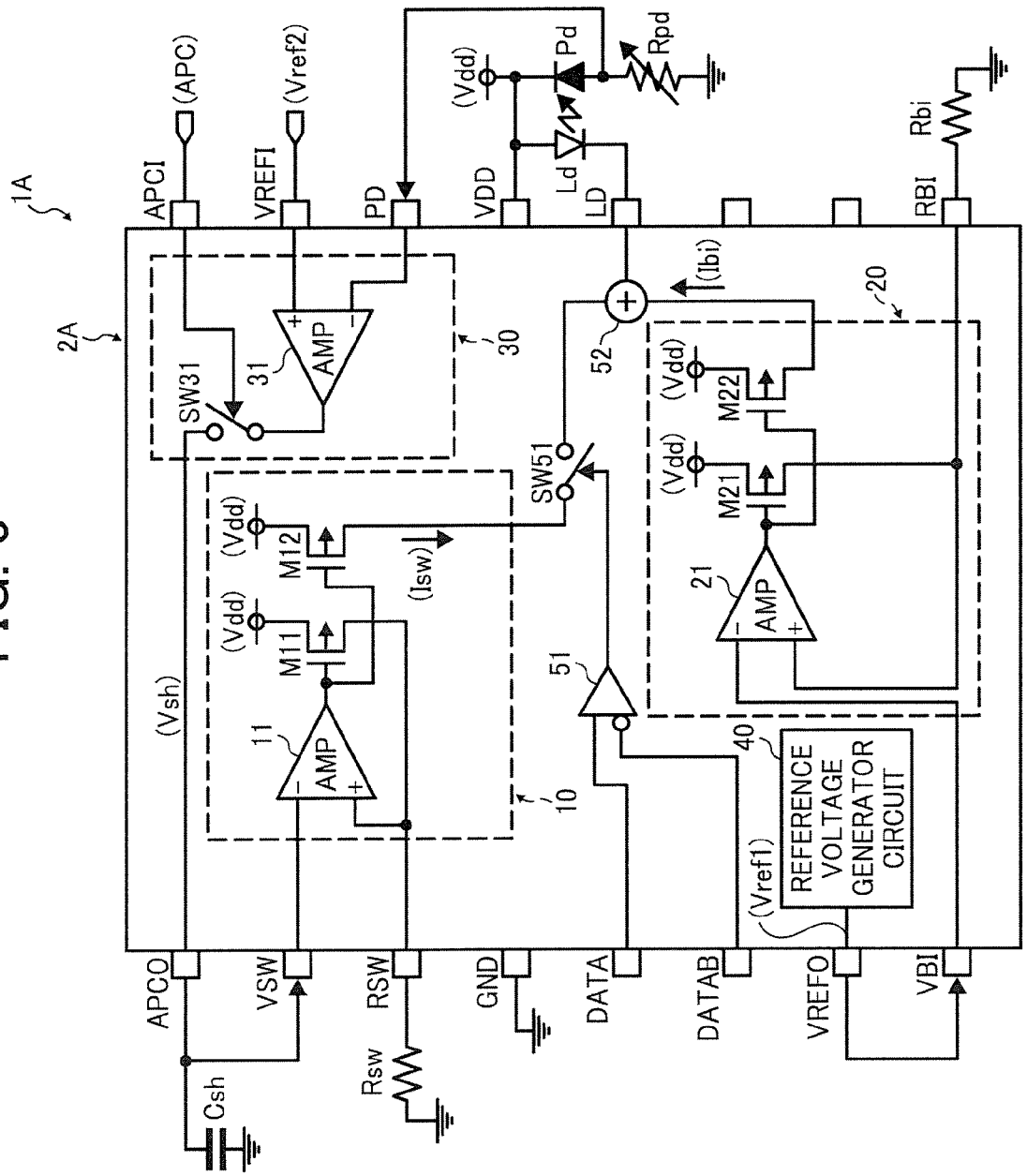
FIG. 5 is a circuit diagram of the semiconductor laser driving device shown in FIG. 4.

Referring to FIGS. 4 and 5, a description is now given of a semiconductor laser driving device 1A according to another illustrative embodiment.

FIG. 4 is a circuit diagram of the semiconductor laser driving device 1A. The semiconductor laser driving device 1A further includes a reference voltage generator circuit 40 and a reference voltage output terminal VREFO.

The reference voltage generator circuit 40 generates a reference voltage Vref1, serving as a second reference voltage, and outputs the reference voltage Vref1 from the reference voltage output terminal VREFO. Although in the semiconductor laser driving device 1 depicted in FIG. 3 the reference voltage Vref1 is input from outside the semiconductor laser 2, in the semiconductor laser driving device 1A the reference voltage Vref1 is generated by the reference voltage generator circuit 40 provided inside the semiconductor device 2A. The other elements of the semiconductor laser driving device 1A are equivalent to those of the semiconductor laser driving device 1.

The reference voltage output terminal VREFO is connected to the switching current control terminal VSW. Note that the reference voltage Vref1 generated by the reference voltage generator circuit 40 may also be used as the reference voltage Vref2.

Operation of the semiconductor laser driving device 1A is identical to that of the semiconductor laser driving device 1 depicted in FIG. 3, except that the reference voltage Vref1 input to the switching current control terminal VSW is generated inside the semiconductor device 2A.

Accordingly, when the reference voltage Vref1 generated by the reference voltage generator circuit 40 provided inside the semiconductor device 2A is input to the switching current control terminal VSW, the switching current Isw is kept constant while the bias current Ibi is controlled according to the output voltage Vsh of the memory circuit 30. Therefore, the semiconductor laser driving device 1A has a circuit configuration more suitable for controlling the laser diode Ld that has a large fluctuation in the threshold current Ith than a laser diode that has a large fluctuation in the light-emitting efficiency, and achieves the same effect as that of the semiconductor laser driving device 1 depicted in FIG. 3.

FIG. 5 is a circuit diagram of the semiconductor laser driving device 1A shown in FIG. 4 in which the APC output terminal APCO is connected to the switching current control terminal VSW, and the reference voltage output terminal VREFO is connected to the bias current control terminal VBI. Note that, as with the semiconductor laser driving device 1A described above, the reference voltage Vref1 may also be used as the reference voltage Vref2.

In this case, the switching current Isw is controlled according to the output voltage Vsh of the memory circuit 30 while the bias current Ibi is kept constant, and thus the semiconductor laser driving device 1A is more suitable for controlling a laser diode Ld that has a large fluctuation in the light-emitting efficiency than a laser diode that has a large fluctuation in the threshold current Ith, and achieves the same effect as described above.

According to this illustrative embodiment, since the semiconductor laser driving device 1A includes the reference voltage generator circuit 40 provided inside the semiconductor device 2A, the semiconductor laser driving device 1A does not need the reference voltage input from outside the semiconductor device 2A, thereby becoming more compact and inexpensive. In addition, by merely changing connection externally, the laser diode driving device 1A has both a circuit for controlling the bias current Ibi by APC and a circuit for controlling the switching current Isw by APC, so that the semiconductor laser driving device 1A is appropriate for both a laser diode Ld that has a large fluctuation in the threshold current Ith and a laser diode Ld that has a large fluctuation in the light-emitting efficiency.

Figure 6:
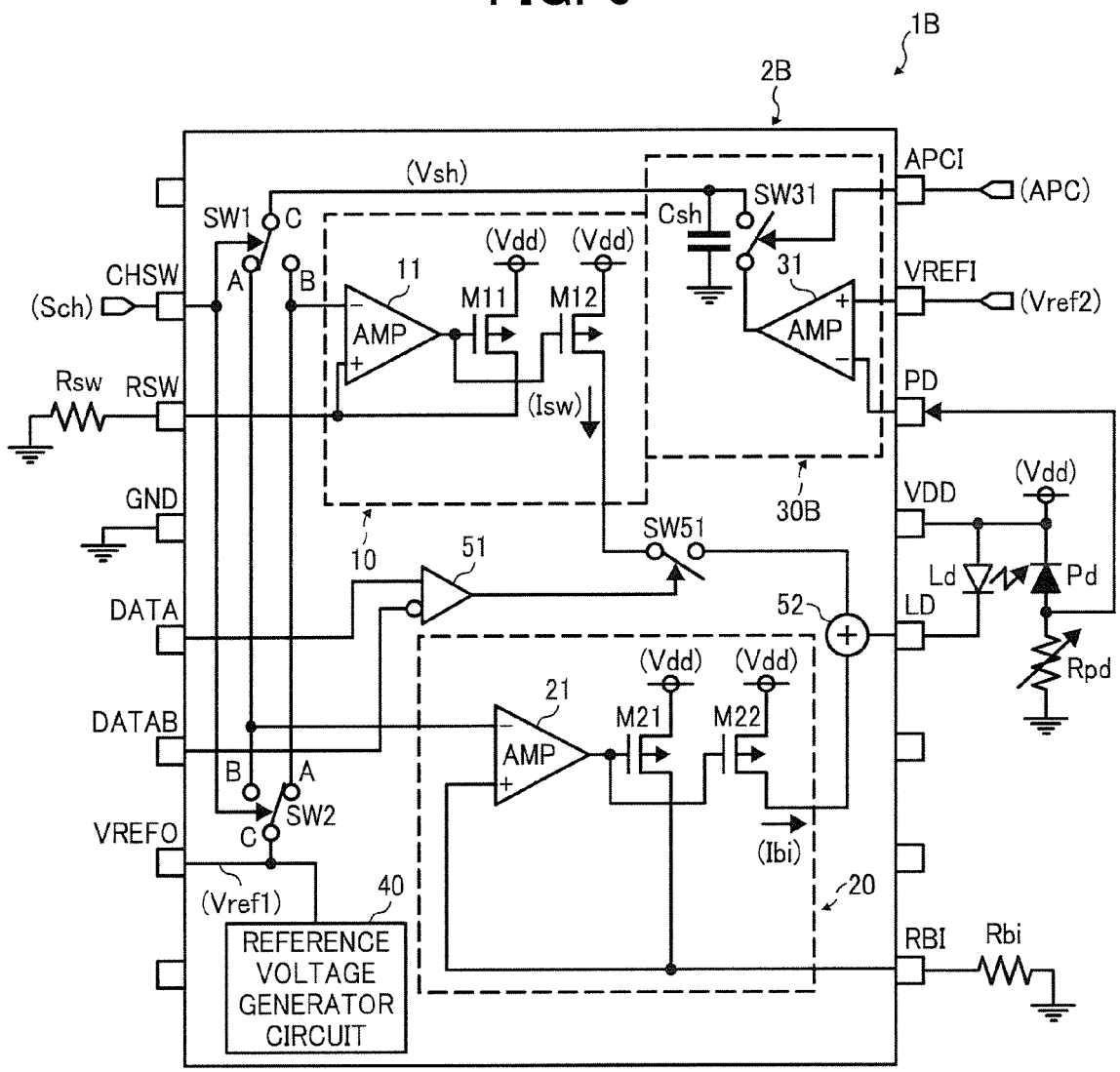
FIG. 6 is a circuit diagram of a semiconductor laser driving device according to yet another illustrative embodiment of the present invention.

Referring to FIG. 6, a description is now given of a semiconductor laser driving device 1B according to yet another illustrative embodiment.

FIG. 6 is a circuit diagram of the semiconductor laser driving device 1B. The semiconductor device 2B includes a first switch SW1, a second switch SW2, and a switching signal input terminal CHSW. The semiconductor device 2B does not include the switching current control terminal VSW, the APC output terminal APCO, and the bias current control terminal VBI of the semiconductor device 2A. The memory circuit 30B includes the sample-hold capacitor Csh.

According to this illustrative embodiment, the sample-hold capacitor Csh is provided inside the memory circuit 30B and connected between the switch 31 and a ground potential. One terminal of the switch SW31 is connected to the output terminal of the operational amplifier 31, and another terminal of the switch SW31 is connected to a common terminal C of the first switch SW1. A terminal A of the first switch SW1 is connected to the non-inverting input terminal of the operational amplifier 21, and a terminal B of the first switch SW1 is connected to the inverting input terminal of the operational amplifier 11. The output voltage Vsh of the memory circuit 30B is input to the common terminal C of the first switch SW1. A terminal A of the second switch SW2 is connected to the inverting input terminal of the operational amplifier 11, and a terminal B of the second switch SW2 is connected to the non-inverting input terminal of the operational amplifier 21. The reference voltage Vref1 is input to a common terminal C of the second switch SW2.

The first switch SW1 and the second switch SW2 are controlled based on a switching signal Sch input to the switching signal input terminal CHSW. When, for example, the switching signal Sch is at a low level, the common terminal C of the first switch SW1 is connected to the terminal A of the first switch SW1, and the common terminal C of the second switch SW2 is connected to the terminal A of the second switch SW2. When the switching signal Sch is high, the common terminal C of the first switch SW1 is connected to the terminal B of the first switch SW1, and the common terminal C of the second switch SW2 is connected to the terminal B of the second switch SW2.

When the switching signal Sch is low, and the respective common terminals C are connected to the respective terminals A, the output voltage Vsh of the memory circuit 30B is input to the inverting input terminal of the operational amplifier 21, and the reference voltage Vref1 generated by the reference voltage generator circuit 40 is input to the inverting input terminal of the operational amplifier 11. Therefore, as in the semiconductor laser driving device 1A depicted in FIG. 4, the output voltage Vsh of the memory circuit 30B is input to the inverting input terminal of the operational amplifier 21 of the bias current generator circuit 20, and the reference voltage Vref 1 generated by the reference voltage generator circuit 40 is input to the inverting input terminal of the operational amplifier 11 of the switching current generator circuit 10, thereby controlling the bias current Ibi by APC.

By contrast, when the switching signal Sch is high, and the respective common terminals C are connected to the respective terminals B, the output voltage Vsh of the memory circuit 30B is input to the inverting input terminal of the operational amplifier 11 of the switching current generator circuit 10, and the reference voltage Vref1 generated by the reference voltage generator circuit 40 is input to the inverting input terminal of the operational amplifier 21 of the bias current generator circuit 20. Therefore, as in the semiconductor laser driving device 1A depicted in FIG. 5, the output voltage Vsh of the memory circuit 30B is input to the inverting input terminal of the operational amplifier 11 of the switching current generator circuit 10, and the reference voltage Vref 1 generated by the reference voltage generator circuit 40 is input to the inverting input terminal of the operational amplifier 21 of the bias current generator circuit 20, thereby controlling the switching current Isw by APC.

According to this illustrative embodiment, the semiconductor laser driving device 1B has the same effect as that of the semiconductor laser driving device 1A depicted in FIGS. 4 and 5. In addition, the semiconductor laser driving device 1B can switch control current between the bias current Ibi and the switching current Isw based on the switching signal Sch. Thus, the semiconductor laser driving device 1B can be used both for a laser diode Ld greatly fluctuating in the threshold current Ith and a laser diode Ld greatly fluctuating in the light-emitting efficiency without changing connection outside the semiconductor device 2B.

Figure 7:
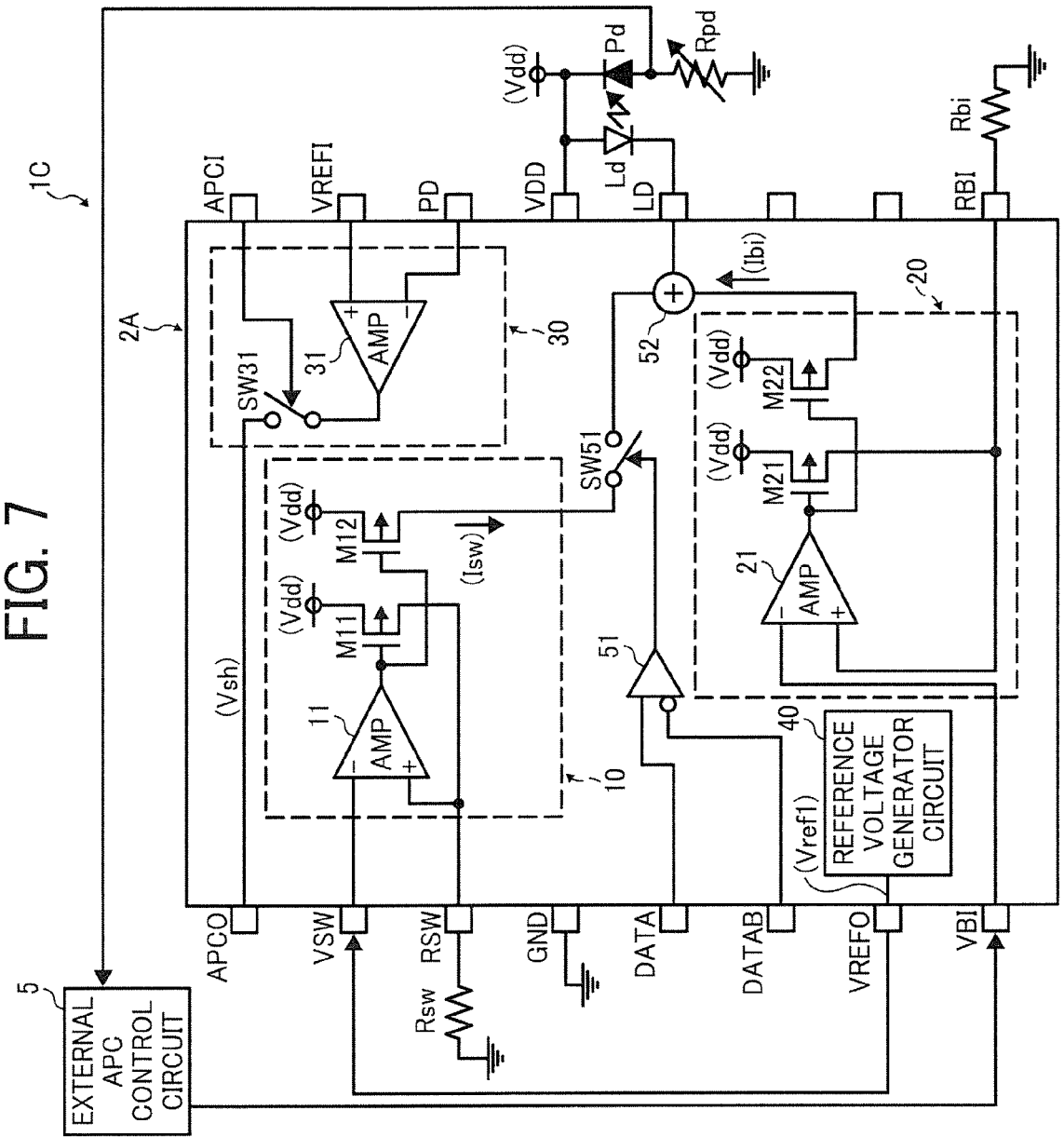
FIG. 7 is a circuit diagram of a semiconductor laser driving device according to yet another illustrative embodiment of the present invention.
Figure 8:
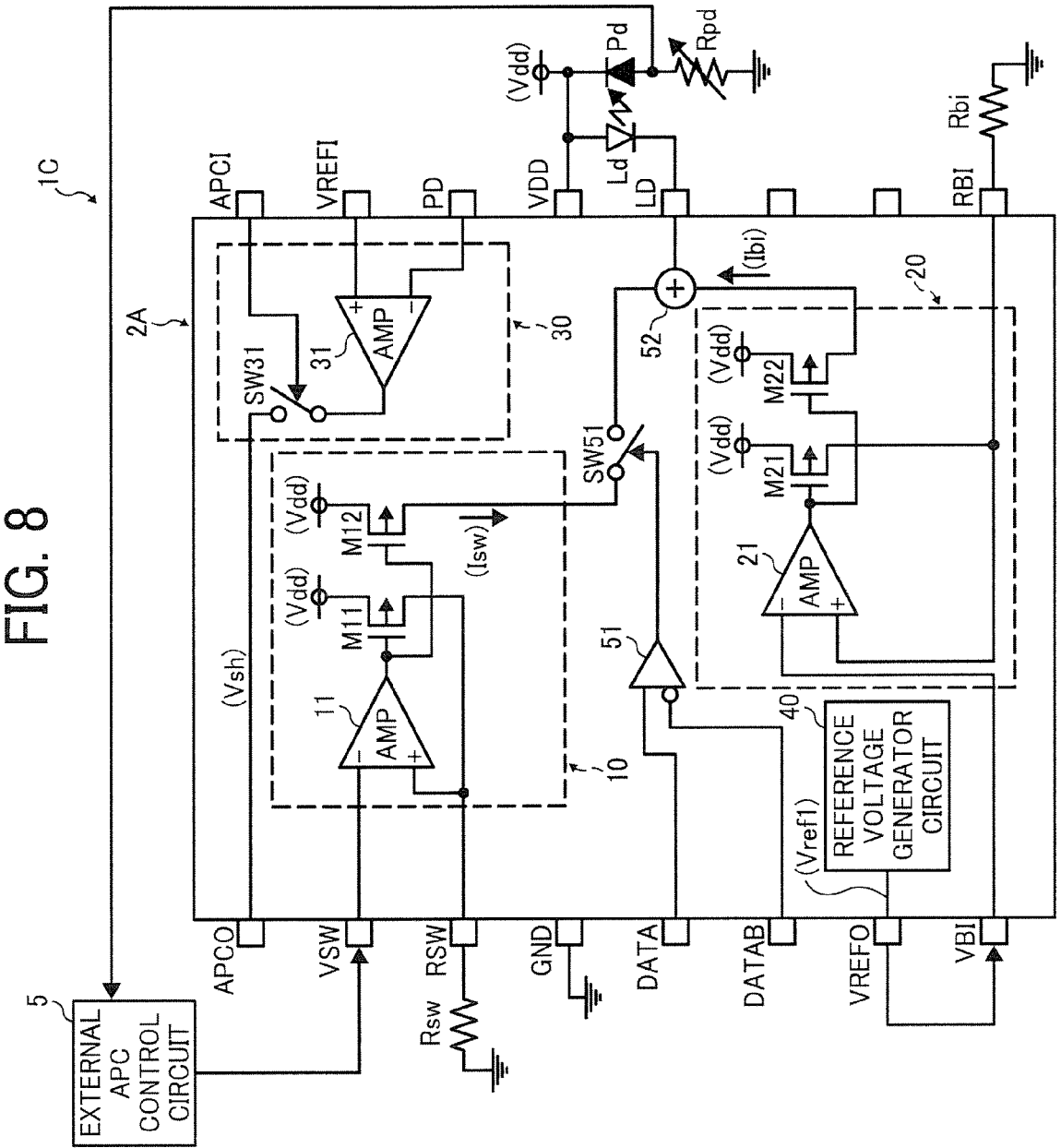
FIG. 8 is a circuit diagram of the semiconductor laser driving device shown in FIG. 7.
Figure 9:
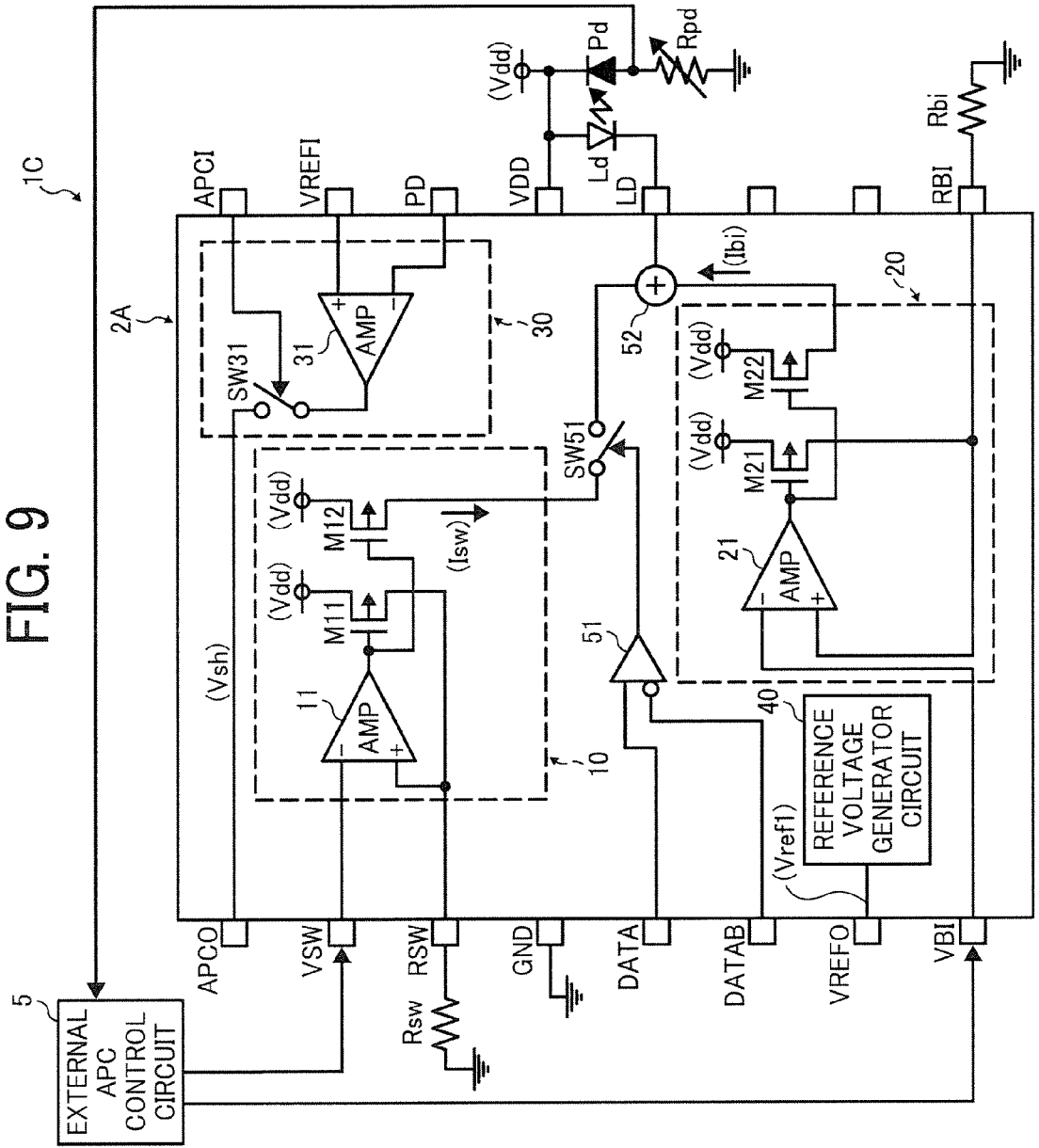
FIG. 9 is a circuit diagram of the semiconductor laser driving device shown in FIG. 7.

Referring to FIGS. 7, 8, and 9, a description is now given of a semiconductor laser driving device 1C according to yet another illustrative embodiment. FIG. 7 is a circuit diagram of the semiconductor laser driving device 1C. The semiconductor laser driving device 1C does not include the sample-hold capacitor Csh of semiconductor laser driving devices 1A and 1B.

According to this illustrative embodiment, the APC signal is not input to the APC signal input terminal APCI, and the reference voltage Vref2 is not input to the reference voltage input terminal VREFI. In addition, the anode of the photodiode Pd is not connected to the photodiode connection terminal PD. Although the semiconductor device 2A depicted in FIG. 7 includes the memory circuit 30, the semiconductor device 2A does not require the memory circuit 30. The other elements of the semiconductor laser driving device 1C are equivalent to those of the semiconductor laser driving device 1A depicted in FIG. 4.

An external APC control circuit 5 is provided outside the semiconductor device 2A, and operates the same way that the memory circuit 30 depicted in FIG. 4 does. A voltage converted by the variable resistor Rpd is input to the external APC control circuit 5. By opening the APC signal input terminal APCI or inputting a high APC signal to the APC signal input terminal APCI, it is possible to cause the switch SW31 to be constantly turned off to create a shutoff state, thereby stopping operation of the memory circuit 30. Like the memory circuit 30, the external APC control circuit 5 generates a voltage equal to the output voltage Vsh of the memory circuit 30 and outputs the voltage to the bias current control terminal VBI of the semiconductor device 2A. The other operations of the semiconductor laser driving device IC are identical to those of the semiconductor laser driving device 1A depicted in FIG. 4.

FIG. 8 is a circuit diagram of the semiconductor laser driving device 1C structurally equivalent to the semiconductor laser driving device 1A depicted in FIG. 5, except that the semiconductor laser driving device 1C uses the output voltage of the external APC control circuit 5 instead of using that of the memory circuit 30.

A voltage converted by the variable resistor Rpd is input to the external APC control circuit 5. Opening the APC signal input terminal APCI or inputting a high APC signal to the APC signal input terminal APCI cause the switch SW31 to be constantly turned off to switch into a shutoff state, thereby stopping operation of the memory circuit 30. Like the memory circuit 30 depicted in FIG. 5, the external APC control circuit 5 generates a voltage equal to the output voltage Vsh of the memory circuit 30 and outputs the voltage to the switching current control terminal VSW of the semiconductor device 2A. The other operations of the semiconductor laser driving device 1C are identical to those of the semiconductor laser driving device 1A depicted in FIG. 5.

FIG. 9 is a circuit diagram of the semiconductor device 1C in which the external APC control circuit 5 generates the reference voltage Vref1 as well as the voltage equal to the output voltage Vsh of the memory circuit 30. Although included here, note that the reference voltage generator circuit 40 need not be included in the semiconductor device 1C. The reference voltage Vref1 generated by the external APC control circuit 5 is input to the bias current control terminal VBI, and the voltage equal to the output voltage Vsh of the memory circuit 30 is input to the switching current control terminal VSW. Accordingly, the semiconductor laser driving device 1C can simultaneously control both the bias current Ibi and the switching current Isw by APC.

Figure 10:
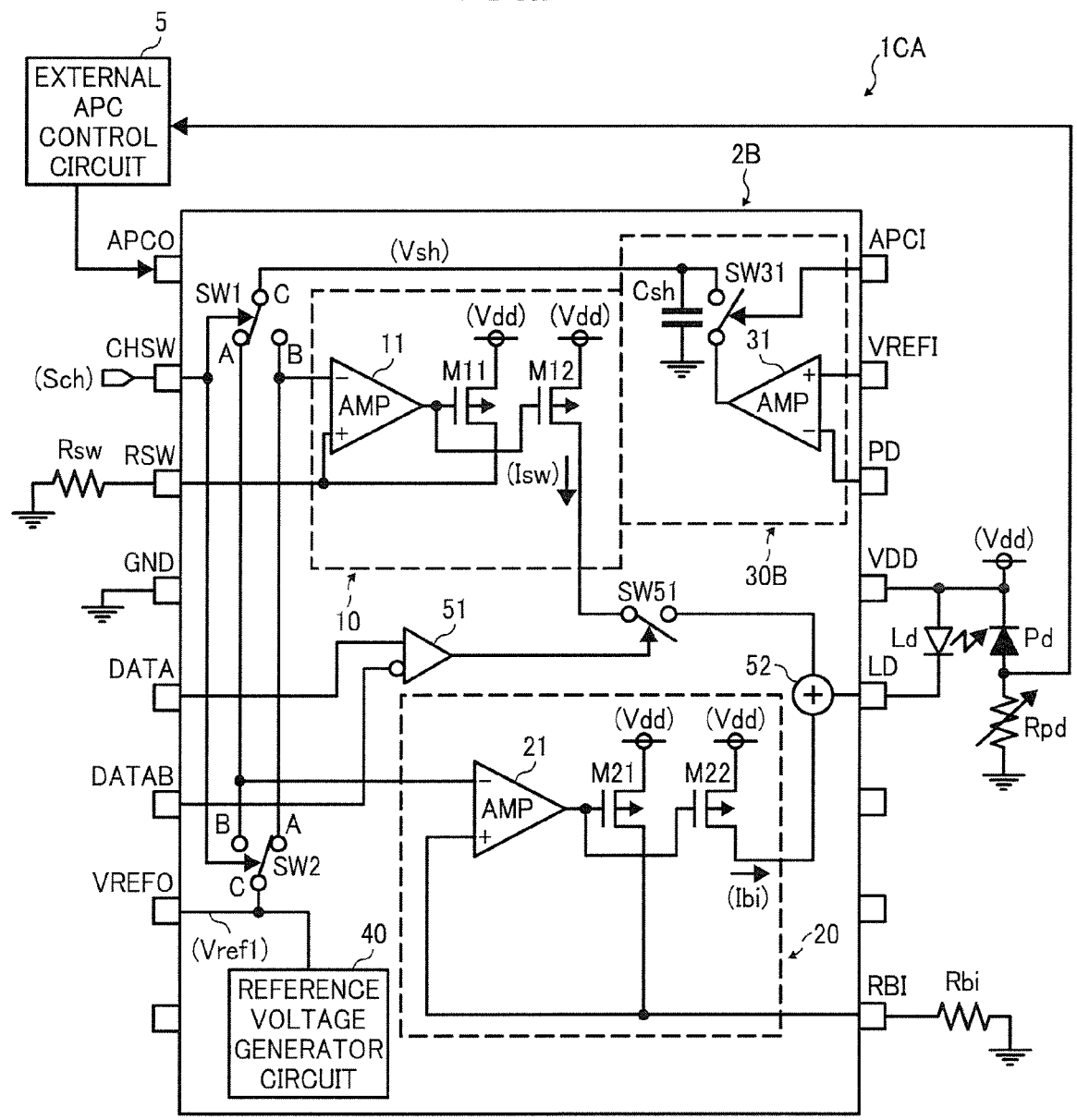
FIG. 10 is a circuit diagram of a semiconductor laser driving device according to yet another illustrative embodiment of the present invention.

Referring to FIG. 10, a description is now given of a semiconductor laser driving device 1CA according to yet another illustrative embodiment. FIG. 10 is a circuit diagram of the semiconductor laser driving device 1CA.

An external APC control circuit 5 is provided outside the semiconductor device 2B and performs the same operation as that of the memory circuit 30B. That is, instead of the memory circuit 30B, an external APC control circuit 5 generates a voltage equal to the output voltage Vsh of the memory circuit 30B. The APC signal is not input to the APC signal input terminal APCI, and the reference voltage Vref2 is not input to the reference voltage input terminal VREFI. Further, the anode of the photodiode Pd is not connected to the photodiode connection terminal PD. The other elements of the semiconductor laser driving device 1CA are equal to the semiconductor laser driving device 1B depicted in FIG. 6. Note that, although depicted here, the memory circuit 30B need not be included in the semiconductor device 2B.

A voltage converted by the variable resistor Rpd is input to the external APC control circuit 5. Since the APC signal input terminal APCI is open, or a high APC signal is input to the APC signal input terminal APCI, the switch SW31 is constantly turned off to switch into a shutoff state, thereby stopping operation of the memory circuit 30B. The external APC control circuit 5 operates the same way that the memory circuit 30B depicted in FIG. 6 does. That is, the external APC control circuit 5 generates a voltage equal to the output voltage Vsh of the memory circuit 30B and output the voltage to the APC output terminal APCO. The other operations of the semiconductor laser driving device 1CA are identical to those of the semiconductor laser driving device 1B.

According to the above-described illustrative embodiment, instead of the memory circuit 30B provided inside the semiconductor device 2B, the external APC control circuit 5 provided outside the semiconductor device 2B generates a voltage equal to the output voltage Vsh of the memory circuit 30B and outputs the voltage to the APC output terminal APCO, thereby performing APC with increased precision.

It is to be noted that the semiconductor laser driving devices 1, 1A, 1B, 1C, and 1CA can be used for an image forming apparatus, for example, a laser printer, a digital copier, and the like.

This invention may be implemented as convenient using a conventional general-purpose digital computer programmed according to the teachings of the present specification, as will be apparent to those skilled in the computer art. Appropriate software coding can readily be prepared by skilled programmers based on the teachings of the present disclosure, as will be apparent to those skilled in the software art. The present invention may also be implemented by the preparation of application specific integrated circuits or by interconnecting an appropriate network of conventional component circuits, as will be readily apparent to those skilled in the art.

As can be appreciated by those skilled in the art, although the present invention has been described above with reference to specific illustrative embodiments the present invention is not limited to the specific embodiments described above, and various modifications and enhancements are possible without departing from the spirit and scope of the invention. It is therefore to be understood that the present invention may be practiced otherwise than as specifically described herein. For example, elements and/or features of different illustrative embodiments may be combined with each other and/or substituted for each other within the scope of the present invention.

What is claimed is:

1. A semiconductor device for driving a semiconductor laser using a drive current combining a bias current and a switching current by controlling the drive current to obtain a predetermined amount of light to be emitted by the semiconductor laser, the semiconductor device comprising:
   a switching current control terminal for controlling the switching current;
   a switching current setting terminal for setting a value of the switching current;
   a switching current generator circuit configured to generate and output the switching current such that a voltage input to the switching current setting terminal is equal to a voltage input to the switching current control terminal;
   a bias current control terminal for controlling the bias current;
   a bias current setting terminal for setting a value of the bias current;
   a bias current generator circuit configured to generate and output the bias current so that a voltage input to the bias current setting terminal is equal to a voltage input to the bias current control terminal;
   a memory circuit configured to receive a voltage according to an amount of light emitted by the semiconductor laser and generate a voltage to make the input voltage equal to a predetermined first reference voltage that corresponds to a predetermined amount of light, store the generated voltage, and output the stored voltage;
   an APC output terminal for outputting the voltage output by the memory circuit to an external device; and
   a current adding circuit configured to combine the switching current and the bias current to generate the drive current to drive the semiconductor laser.

2. The semiconductor device according to claim 1,
   wherein the APC output terminal is connected to one of the bias current control terminal and the switching current control terminal.

3. The semiconductor device according to claim 1, further comprising:
   a reference voltage generator circuit configured to generate a second reference voltage and output the second reference voltage; and
   a reference voltage output terminal for outputting the second reference voltage to an external device.

4. The semiconductor device according to claim 3,
   wherein the APC output terminal is connected to the bias current control terminal, and the reference voltage output terminal is connected to the switching current control terminal, and
   wherein the current adding circuit combines the bias current controlled based on the output voltage of the memory circuit and the switching current of a constant value.

5. The semiconductor device according to claim 3,
wherein the APC output terminal is connected to the switching current control terminal, and the reference voltage output terminal is connected to the bias current control terminal, and
wherein the current adding circuit combines the switching current controlled based on the output voltage of the memory circuit and the bias current of a constant value.

6. The semiconductor device according to claim 3,
wherein a light amount control signal for controlling the amount of light emitted by the semiconductor laser is input to the switching current control terminal, and
wherein the bias current control terminal is connected to the reference voltage output terminal.

7. The semiconductor device according to claim 3,
wherein a light amount control signal for controlling the amount of light emitted by the semiconductor laser is input to the bias current control terminal, and
wherein the switching current control terminal is connected to the reference voltage output terminal.

8. The semiconductor device according to claim 3,
wherein a light amount control signal for controlling the amount of light emitted by the semiconductor laser is input to the switching current control terminal and the bias current control terminal.

* * * * *